(12) United States Patent
Zantye et al.

(10) Patent No.: US 7,942,945 B1
(45) Date of Patent: May 17, 2011

(54) CMP SLURRY FOR POLYMERIC INTERLAYER DIELECTRIC PLANARIZATION

(75) Inventors: Parshuram B. Zantye, Morganville, NJ (US); Arun Kumar, Tampa, FL (US); Ashok Kumar, Tampa, FL (US)

(73) Assignee: University of South Florida, Tampa, FL (US)

( * ) Notice: Subject to any disclaimer, the term of this patent is extended or adjusted under 35 U.S.C. 154(b) by 0 days.

(21) Appl. No.: 11/308,450

(22) Filed: Mar. 27, 2006

Related U.S. Application Data

(60) Provisional application No. 60/594,309, filed on Mar. 28, 2005.

(51) Int. Cl.
*B24D 3/02* (2006.01)
*C09C 1/68* (2006.01)
*C09K 3/14* (2006.01)
*C09K 3/13* (2006.01)
*C09K 3/04* (2006.01)
*C09K 13/06* (2006.01)
*C09G 1/02* (2006.01)

(52) U.S. Cl. .......... 51/308; 51/307; 252/79.1; 252/79.2; 252/79.4; 106/3

(58) Field of Classification Search .............. 51/308, 51/298, 307; 106/3; 252/79.1, 79.2, 79.4
See application file for complete search history.

(56) References Cited

U.S. PATENT DOCUMENTS

| 5,904,159 | A  | * | 5/1999 | Kato et al. | 134/7 |
| 6,177,026 | B1 | * | 1/2001 | Wang et al. | 252/79.1 |
| 6,322,600 | B1 | * | 11/2001 | Brewer et al. | 51/308 |
| 2003/0178320 | A1 | * | 9/2003 | Liu et al. | 205/640 |

OTHER PUBLICATIONS

Abreu Da Silva et al. 2007. "Rhodamine B-Containing Silica Films From TEOS Precursor: Substrate Surface Effects Detected by Photoluminescence." Surface Science. vol. 601. pp. 1118-1122.

* cited by examiner

*Primary Examiner* — Anthony J Green
*Assistant Examiner* — Pegah Parvini
(74) *Attorney, Agent, or Firm* — Michele L. Lawson; Robert Varkonyi Smith & Hopen, P.A.

(57) ABSTRACT

The proposed slurry can be used to planarize polymeric candidate ILD materials such Benzocylobutene (BCB), SILK, Polyimide, etc. The slurry consists of colloidal suspension of nanoparticle abrasives made up of Tetraethylorthosilicate (TEOS)-derived silica and Zirconium-dioxide ($ZrO_2$), its derivatives and any materials modified from $ZrO_2$ and/or TEOS, in a chemically active medium. The base solution of the slurry consists of deionized (DI) water, buffering agents like inorganic buffer comprised of inorganic acids such as TRIS-Hcl, its derivatives and variants, cleansing agents, surface modified catalysts, and surface reagents. The organic solvents like isopropyl alcohol, methanol, and other organic alcohols ranging from 0.0005 to 0.05% are employed for active dissolution of the chemical surface complex formed as a result of the slurry chemical action. The inorganic buffer is so chosen that the complex salts resulting from the reaction impart hydrophobicity to the polished thin film surface. The advantages of hydrophobicity include: a) reduced particle adhesion on surface, b) less intensive post-CMP clean, c) no surface degradation or contamination, etc.

10 Claims, No Drawings

CMP SLURRY FOR POLYMERIC INTERLAYER DIELECTRIC PLANARIZATION

CROSS-REFERENCE TO RELATED APPLICATION

This application claims priority to U.S. Provisional Patent Application No. 60/594,309, filed Mar. 28, 2005, the contents of which are herein incorporated by reference.

FIELD OF INVENTION

The present invention relates to a chemical mechanical polishing slurry. More particularly, this invention relates to a nanoparticle-based CMP slurry for polymeric dielectric planarization utilizing Zicronium-dioxide and Tetraethylorthosilicate TEOS-derived silica nanoparticle abrasives.

BACKGROUND OF THE INVENTION

The semiconductor industry is constantly striving to improve the Integrated Circuits (IC) by: 1) reducing their operating delay, 2) adding more functionality and complexity, 3) adding more versatility, and 4) reducing the size. The complete and flawless global planarization of the thin film materials that form the wiring of the present day integrated circuit (IC) is one of the most prominent challenges in front of the semiconductor industry today.

With the incorporation of polymeric low dielectric constant materials (low k) in the IC wiring to increase the circuit speed, the demand for effective planarization has increased dramatically. Chemical Mechanical Polishing (CMP) process is universally used to planarize the constituent thin films of the IC interconnect wiring scheme. Compared to the other materials in the IC (e.g. Silicon, Tungsten, Silica, etc.), polymeric low k materials are much softer as compared to the abrasive particles used in the chemical active solution used (CMP Slurry) during the polishing process.

Hence, controlling polymeric ILD polishing to meet the stringent demands of the semiconductor industry and producing IC wiring without: 1) micro/nano scratching, 2) over polish, pattern damage, trough formation, etc, 3) material delamination, etc. is of paramount importance to make more sophisticated and cost effective chips of tomorrow.

SUMMARY OF INVENTION

The present invention provides a slurry for polymeric interlayer dielectric planarization comprising a colloidal suspension of TEOS-derived silica and $ZrO_2$ in a chemically active medium. In an advantageous embodiment the TEOS-derived silica and $ZrO_2$ are nanoparticles ranging in size from about 10 nm to about 200 nm and can have a particle concentration of the nanoparticles of TEOS-derived silica and $ZrO_2$ that range from about 2% to about 12% by weight. The slurry can employ one or more catalysts. Advantageous catalysts include $TiO_2$, ZnO and $SnO_2$. The slurry may also contain polyamide in the solution to prevent recombination of Si radical with BCB. Lastly, it is found advantageous to include one or more inorganic acids in the slurry. Preferred acids include TRIS-HCl, $HNO_3$ and $H_2SO_4$.

DETAILED DESCRIPTION OF THE PREFERRED EMBODIMENT

This invention is further illustrated by the following examples which should not be construed as limiting. The proposed slurry promises to be helpful in achieving the aforementioned demands of the semiconductor industry within the strict tolerances prescribed. Thus, this new technology will facilitate in the achievement of the widely published objectives of the semiconductor industry. Additionally this proposed slurry does not require any special conditions for operation.

These and other advantages will significantly bring down the cost of ownership (COO) of the CMP operations. The universal benefits of this technology include: 1) decrease in the IC cost, 2) wide implementation of the IC, 3) more versatility and faster operation the next current electronic products.

The proposed slurry has been used polishing and planarization of polymeric ILD materials specifically BCB. BCB is a highly thermostatic structure with inorganic —Si— linkage in the polymer which provides toughness and increases the glass transition temperature (Tg). The slurry consists of similar and variable sized Zicronium-dioxide ($ZrO_2$) and Tetraethylorthosilicate (TEOS)-derived silica nanoparticle abrasives ranging from 10 nm to 200 nm.

Each type of particle is employed on a stand-alone basis or in combination for the purpose of abrasion of the surface layer complex formed during CMP. The particle concentration of the slurry solution ranges from 2 to 12% by weight. The primary objective of the slurry is to precisely control the desired CMP output variables and prevent defects such as: 1) high surface roughness, 2) micro/nano scratching, 3) dishing, erosion or pattern damage, 4) delamination, 5) local nonplanarity. The slurry solution is made of DI water and inorganic acids specifically TRIS-HCl, $HNO_3$, $H_2SO_4$ for surface reaction and active dissolution of the polymeric ILD being polished. The pH of the slurry is maintained between 2.0 to 12.0. The surface reactions are carried out in presence of catalysts such a $TiO_2$, ZnO, $SnO_2$, other metal oxides, ceramics, and elements and compounds derived and modified from them.

The abrasion of the material is carried out by maintaining the aforementioned abrasives along with formation of a nanoporous silica film as a result of the breaking Si—BCB linkage. The nanoporous silica also forms a protective thin film on the surface of the ILD materials, there by protecting it from the adverse effects of heat generation due to exothermic chemical reactions and mechanical abrasion.

The thin film has also shown to inhibit the heat transfer of the process to the polishing pad. This prevents the adverse process effects that may be caused due to pad surface heating and viscoelastic material reflow which inevitably leads to pad compliance and loss in planarity.

The slurry also contains polyamide in the solution to prevent recombination of Si radical with BCB. Finally, the complex salts formed as a result of the reaction also make the surface hydrophobic by reacting with the oxygen and nitrogen of the sample surface.

What is claimed is:

1. A chemical mechanical polishing (CMP) slurry for polymeric interlayer dielectric planarization consisting essentially of:
   a colloidal suspension comprising a plurality of abrasive particles;
      wherein each abrasive particle is further comprised of a combination of TEOS-derived silica and $ZrO_2$;
   a chemically active medium having a pH of between 2 and 7, wherein the chemically active medium is comprised of one or more catalysts and at least one inorganic acid;
   whereby the slurry forms a nanoporous silica film to protect against heat generation during polishing.

2. The slurry of claim 1 wherein the TEOS and $ZrO_2$ particles range in size from about 10 nm to about 200 nm.

3. The slurry of claim 2 wherein the particle concentration of TEOS and $ZrO_2$ is between about 2% and about 12% by weight.

4. The slurry of claim 2 wherein the TEOS particles are between about 50 nm and about 100 nm in size.

5. The slurry of claim 2 wherein the TEOS particles are between 10 nm and 100 nm in size.

6. The slurry of claim 1 wherein the one or more catalysts are selected from the group consisting of $TiO_2$, ZnO and $SnO_2$.

7. The slurry of claim 1 wherein the at least one inorganic acids is selected from the group consisting of TRIS-HCl, $HNO_3$ and $H_2SO_4$, and a combination thereof.

8. The slurry of claim 1 further comprising a polyamide.

9. The slurry of claim 1, further comprising at least one organic alcohol, wherein the alcohol content of the slurry is between 0.005-0.05% by weight.

10. The slurry of claim 9, wherein the organic alcohol is selected from the group consisting of isopropyl alcohol and methanol.

* * * * *